(12) United States Patent
Ohga et al.

(10) Patent No.: US 6,301,936 B1
(45) Date of Patent: Oct. 16, 2001

(54) APPARATUS FOR MANUFACTURING POROUS GLASS PREFORM

(75) Inventors: Yuichi Ohga; Takashi Kogo, both of Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/334,925

(22) Filed: Jun. 17, 1999

(30) Foreign Application Priority Data

Jun. 17, 1998 (JP) .................................................. 10-169805
Dec. 1, 1998 (JP) .................................................. 10-340881

(51) Int. Cl.[7] .................................................. C03B 20/00
(52) U.S. Cl. .................................................. 65/531; 65/414; 65/420
(58) Field of Search .................................................. 65/17.4, 159, 323, 65/414, 420, 531

(56) References Cited

U.S. PATENT DOCUMENTS

| | | | |
|---|---|---|---|
| 4,328,018 | * | 5/1982 | Siegfried .................................................. 65/420 |
| 5,039,325 | * | 8/1991 | Miller et al. .................................................. 65/397 |
| 5,676,725 | * | 10/1997 | Ito et al. .................................................. 65/382 |
| 5,851,258 | * | 12/1998 | Ando et al. .................................................. 65/329 |
| 5,951,730 | * | 9/1999 | Schermerhorn .................................................. 65/17.3 |
| 6,044,664 | * | 4/2000 | Yajima et al. .................................................. 65/414 |

FOREIGN PATENT DOCUMENTS

| | | |
|---|---|---|
| 03-33020 | * 2/1991 | (JP) . |
| 3-74630 | 12/1991 | (JP) . |
| 5-330841 | 12/1993 | (JP) . |

* cited by examiner

*Primary Examiner*—Sean Vincent
(74) *Attorney, Agent, or Firm*—McDermott, Will & Emery (57) ABSTRACT

The object of the invention is to provide an apparatus for manufacturing a porous glass preform, which comprises a reaction vessel in which local stress concentration caused by expansion due to heat is prevented, and there is no fear of the occurrence of deformation or cracks. The apparatus of this invention manufactures the porous glass preform by depositing glass particles blown from a burner on the seed rod rotating around its axis, and this apparatus is characterized in that the reaction vessel is provided with a means for relieving concentration of stress due to thermal expansion of the reaction vessel.

9 Claims, 9 Drawing Sheets

(PRIOR ART)

APPARATUS FOR MANUFACTURING POROUS GLASS PREFORM

BACKGROUND OF THE INVENTION

1. Field of the Invention

The present invention relates to an apparatus for manufacturing a porous glass preform, and particularly to a structure of a reaction vessel of the apparatus in which glass particles are synthesized through a flame hydrolysis reaction.

2. Description of the Background

The porous glass preform is manufactured by depositing glass particles, as a core, and further, depositing glass particles thereon as a cladding. Typical methods for manufacturing the porous glass preform are an outside vapor deposition method (OVD) and a vapor-phase axial deposition method (VAD).

For example, the following is disclosed in Japanese Patent Laid-open Publication No. Hei. 5-330841:

A glass raw material made of oxygen, hydrogen, and silicon tetrachloride $SiCl_4$) is fed to an oxyhydrogen burner. The oxyhydrogen burner produces an oxyhydrogen flame, and silicon tetrchloride ($SiCl_4$) in a glass raw material is subjected to hydrolysis in the oxyhydrogen flame, so that glass particles containing silica ($SiO_2$) as the main ingredient are produced. The glass particles are deposited, and finally become the porous glass preform.

Such manufacture of the porous glass preform is carried out in a reaction vessel. Japanese Patent Laid-open Publication No. Hei. 5-330841 also discloses this reaction vessel.

The reaction vessels are made of glass or metallic materials.

With the enlargement of the size of the preform in recent years, metallic materials (Fe—Ni, Ni—Cr or other Ni-based alloys, etc.) have come into conventional use. For example, Japanese Utility Model Laid-open Publication No. Hei. 3-74630 discloses a reaction vessel in which a wall is made of acid resistant metallic materials such as Ni or Ni-based alloy, and at least the inner surface thereof is coated with both heat and acid resistant paint.

The porous glass preform must be manufactured under a clean environment, so that impurities do not penetrate into the preform.

Further, the inside of the reaction vessel has a hydrochloric acid atmosphere. Therefore, the reaction vessel is required to have a degree of air tightness to prevent seepage of chlorine or any chlorine compound. In view of the above and also for the purpose of strength, an integral-type reaction vessel which is monolithically formed or which is constructed of several welded parts, has been used. As an optical fiber drawn from one porous glass preform is longer, production efficiency of optical fiber increases. Thus, the porous glass preform has become larger recently. Accordingly, the reaction vessel in which it is produced and contained has also enlarged. Further, during the manufacture of the porous glass preform, the temperature of an oxyhydrogen flame generated from an oxyhydrogen burner is in a range of 2,000 through 2,700° C., the temperature of deposited glass particles is in a range of 800 through 900° C., and the temperature of the reaction vessel wall is in a range of 300 through 400° C. With the enlargement of the reaction vessel the absolute amount of thermal expansion is increased, causing cracks or distortions in the reaction vessel.

SUMMARY OF THE INVENTION

An object of the present invention is to provide an apparatus for manufacturing a porous glass preform for an optical fiber, which is not prone to be cracked or deformed by thermal expansion during the manufacture of a porous glass preform, especially the manufacture of a large porous glass preform.

A first embodiment of the invention is an apparatus with which a porous glass preform is manufactured by depositing the fine glass particles blown from a burner on a seed rod rotating around its axis and the reaction vessel of which is provided with means for relieving a stress caused to the reaction vessel due to its thermal expansion in the axial direction of the porous glass preform.

The apparatus according to the invention is characterized in that a reaction vessel to be used in the apparatus is provided with a means for relieving concentration of stress due to thermal expansion of the reaction vessel.

Thus, the occurrence of deformations or cracks of the reaction vessel can be restrained.

The second embodiment of the invention is an apparatus for manufacturing the porous glass preform which is characterized in that the said reaction vessel is set with the reaction vessel being held at portions other than the upper portion thereof in such a manner that the center axis of the porous glass preform is positioned in the vertical direction, and said reaction vessel is provided with fixing members around the periphery of the upper portion thereof for preventing its horizontal movement in a manner to allow it to expand and contract in the vertical direction.

Since the fixing members are disposed around the periphery of the reaction vessel, an escape margin of expansion toward the above is secured, the movement of a through hole in the horizontal direction can be prevented, the concentration of the stress can be relieved, and the occurrence of cracks can be restrained.

The third embodiment of the invention is an apparatus for manufacturing a porous glass preform which is characterized in that the said reaction vessel is arranged such that the center axis of the porous glass preform is positioned in the vertical direction, and the upper portion of the reaction vessel is divided into upper and lower parts having an insertion structure which allows the reaction vessel to expand and contract in the vertical direction.

Since the reaction vessel is divided into the upper and lower parts at the upper portion of the reaction vessel, and the insertion structure is adopted as described above, an escape margin of expansion toward the above can be secured, the movement of a through hole in the lateral direction can be prevented, the stress can be relieved, and the occurrence of cracks can be restrained.

The fourth embodiment of the invention is an apparatus for manufacturing the porous glass preform according to the third embodiment, which is characterized in that the insertion structure portion of the divided parts is provided with a means for allowing a purge gas to flow.

With this invention, in the case where the reaction vessel is divided into the upper and lower parts, the entrance of air containing dust through the divided parts can be prevented.

The fifth embodiment of the invention is an apparatus for manufacturing a porous glass preform which is characterized in that the said reaction vessel is set such that the center axis of the porous glass preform is positioned in the vertical direction, and is held with the fixing members for allowing said reaction vessel to expand and contract in a vertical direction, and for restraining the reaction vessel from moving in a horizontal direction.

Since the fixing portions of the reaction vessel are fixed in a state where the reaction vessel can expand and contract in the vertical direction, the escape margin of expansion toward the above can be secured, the movement of a through hole in a lateral direction can be prevented, concentration of stress can be relieved, and the occurrence of cracks can be restrained.

The sixth embodiment of the invention is an apparatus for manufacturing a porous glass preform which is characterized in that said reaction vessel is set such that the center axis of the porous glass fiber is positioned in a horizontal direction and the reaction vessel is held with a plurality of fixing members allowing its expansion and contraction to the axial direction of the center axis of the porous glass fiber and preventing its horizontal movement.

Since the reaction vessel is fixed in the state where the vessel can expand and contract in a longitudinal direction as described above, the escape margin of expansion in a longitudinal direction can be secured, a movement of a through hole toward the side of the vessel is prevented, stress can be relieved and the occurrence of cracks can be restrained.

A seventh embodiment of the invention is an apparatus for manufacturing a porous glass preform which is characterized in that the said reaction vessel comprises a frame and side members forming the side without a door structure, and at least one of said side members is joined to said frame in such a manner that it can move relative to said frame according to its expansion or contraction.

Even in the case where the side member is expanded by heat, the side member slides and shifts relatively to the frame, the expansion can be absorbed and stress due to thermal expansion can be relieved. Thus, cracks or distortion of the vessel can be prevented and the apparatus is not damaged.

The eighth embodiment of the invention is an apparatus for manufacturing a porous glass preform according to the seventh embodiment, which is characterized in that at least one of the side members is joined to said frame with a bolt and a nut, and the hole in said frame or in said side member for allowing said bolt to pass through has a diameter that is 2.0 to 2.5 times as large as a diameter of said bolt.

Accordingly, the occurrence of deformation or cracks of the vessel can be restrained as in the case of the seventh embodiment of the invention.

A ninth embodiment of the invention is an apparatus for manufacturing a porous glass preform which is characterized in that the said reaction vessel comprises a frame and side members forming the side without a door structure, and the side is divided so that at least two side members are arranged side by side in the axial direction of the porous glass preform, and at the divided portion, said frame is joined together through a buffer member which absorbs the thermal expansion.

Since the side is divided through the buffer member, the side area being smaller, the absolute amount of thermal expansion of side members can be made smaller as compared with undivided side members.

Further, since the buffer member absorbs the expansion, the stress due to the thermal expansion can be relieved. Thus, cracks or distortion of the vessel can be prevented, and the apparatus is not damaged.

The tenth embodiment of the invention is an apparatus for manufacturing a porous glass preform which is characterized in that the said reaction vessel comprises a main reaction vessel containing said burner, and an upper reaction vessel, and the bottom of the upper reaction vessel is in the upper portion of said main reaction vessel, and the joint portions of said main reaction vessel and said upper reaction vessel are joined together through a buffer member.

The upper reaction vessel is provided, thereby allowing the length of the main reaction vessel to be short. As a result, the absolute amount of expansion of the side member due to heat can be minimized. Since the bottom surface of the upper reaction vessel is located in the top surface of the main reaction vessel, the side surface area of the upper reaction vessel is made smaller than the side surface area of the main reaction vessel. Thus, the absolute amount of expansion of the upper reaction vessel due to heat does not become such a problem as compared with the main reaction vessel. Further, the buffer member of the joint portions between the main reaction vessel and the upper reaction vessel absorbs expansion; thereby stress due to the thermal expansion can be relieved. Thus, cracks or distortion of the vessel can be prevented, and the apparatus is not damaged.

The eleventh embodiment of the invention is an apparatus for manufacturing a porous glass preform which is characterized in that the said reaction vessel comprises a main reaction vessel containing said burner, and a lower reaction vessel, and the upper portion of said lower reaction vessel is in the bottom of said main reaction vessel, and the joint portions of said main reaction vessel and said lower reaction vessel are joined together through a buffer member.

The lower reaction vessel is provided so that the length of the main reaction vessel is made as short as possible. As a result, the absolute amount of expansion of the side member of the main reaction vessel due to heat can be made as small as possible. Since the top surface of the lower reaction vessel is located within the range of the bottom surface of the main reaction vessel, the side surface areas of the upper reaction vessel and the lower reaction vessel are made smaller than the side surface of the main reaction vessel. Thus, the absolute amount of expansion of the upper reaction vessel and the lower reaction vessel due to heat does not become such a problem as compared with the main reaction vessel. Since the expansion is absorbed by the buffer member in the joint portions of the main reaction vessel and the upper reaction vessel, or of the main reaction vessel and the lower reaction vessel, the stress due to thermal expansion can be relieved. Thus, cracks or distortion of the vessel can be prevented, and the apparatus is not damaged.

The twelfth, thirteenth, or fourteenth embodiment of the invention is the apparatus for manufacturing the porous glass preform which is characterized in that the said buffer member described in each above the ninth, tenth, or eleventh embodiment of the invention is a bellows.

Cracks or distortions of the reaction vessel can be prevented and the apparatus is not damaged.

DESCRIPTION OF THE PREFERRED EMBODIMENTS

The inventions are described more concretely as follows.

The apparatus for manufacturing the porous glass preform of the first embodiment of the invention is provided with a means for relieving the stress due to thermal expansion of the reaction vessel.

The porous glass preform is manufactured by depositing glass particles blown from the burner moving relatively in the longitudinal direction of the seed rod rotating around its axis.

Figure 1:
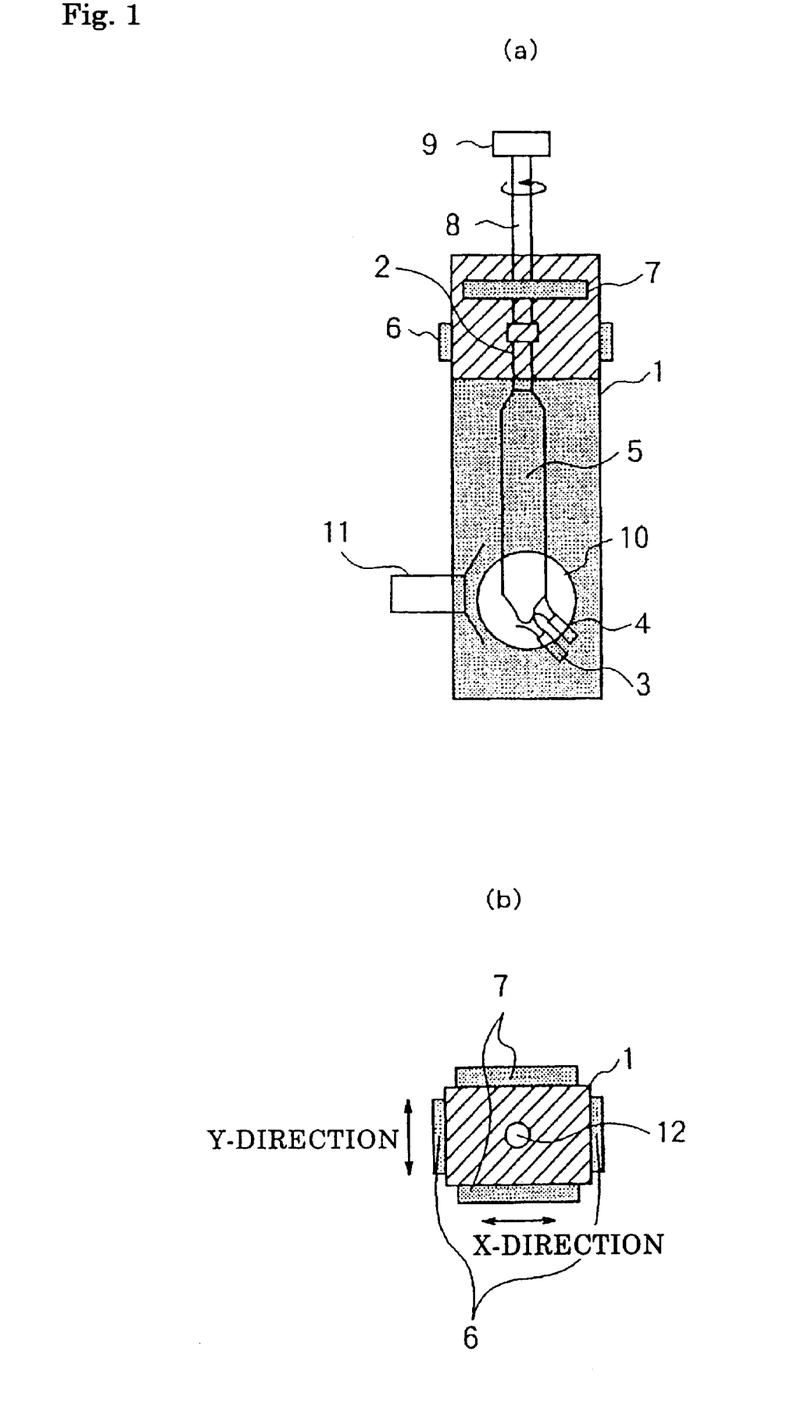
FIGS. 1A and 1B are schematic views illustrating a reaction vessel of the first embodiment of the invention.

The apparatus of the second embodiment of the invention is set in such a manner that the center axis of the porous glass preform takes the vertical direction while its lower portion of the reaction vessel is fixed, as shown in FIG. 1.

As a means for relieving the effect of thermal expansion, the movement preventing members which prevent the reaction vessel from moving to the horizontal direction (vertical direction to the center axis of the porous glass preform) are provided around the periphery of the upper portion of the reaction vessel. The upper portion of the reaction vessel is not fixed and the reaction vessel can expand and contract in the vertical direction (center axial direction of the reaction vessel).

This apparatus manufactures a porous glass preform by a vapor-phase axial deposition WAD) method in which glass particles are adhered and deposited onto a rod-shaped starting member 2 from its tip portion toward its axial direction. A core formation burner 3 and a cladding formation burner 4 are used to manufacture a porous glass preform 5 made of a core and a cladding. FIG. 1A is a front schematic view and FIG. 1B is an upper sectional view of a reaction vessel 1.

The lower end portion of the reaction vessel 1 is fixed to a base or the like, and movement preventing members (X-direction movement suppressing tool 6 and Y-direction movement suppressing tool 7) are provided on its upper portion. These movement preventing members are fixed to steadfast bodies other than the reaction vessel, for example, a lifting or lowering device which lifts or lowers the starting member, and are provided in such a manner that a pair of movement preventing members which are opposite to each other do not change their position. The movement preventing members are provided around the periphery of the reaction vessel for preventing the reaction vessel from moving to the horizontal direction. However, they are not fixed to a wall surface of the reaction vessel, so that the reaction vessel can expand and contract in the vertical direction.

The attachment position of the movement preventing member is within the range from the upper end of the reaction vessel to the position of ½ thereof, preferably within the range of ¹⁄₁₀ to ⅓ from the upper end, for preventing the reaction vessel from moving to the horizontal direction, especially for preventing a through hole from moving.

The size and shape of the movement preventing members are not particularly limited, provided that the function can be attained, and may be suitably determined according to the material of the reaction vessel, utilization conditions, and the like. The material is not particularly limited, and metals such as SUS or Al, carbon, ceramics, or the like can be used.

In FIGS. 1A and 1B, reference numeral 8 denotes a support rod for supporting the rod-shaped starting member 2, 9 denotes a chuck for holding the support rod 8, 10 denotes a quartz window for observation, 11 denotes an exhaust pipe, and 12 denotes a through hole provided in an upper cover of the reaction vessel 1.

EXAMPLE 1

An apparatus of this embodiment comprises the reaction vessel 1 having the shape shown in FIG. 1, made of Ni—Cr alloy, and roughly having a width of 0.8 m, a depth of 0.6 m, and a height of 2.5 m. This apparatus and two burners of the core formation burner 3 and the cladding formation burner 4 were used to manufacture the porous glass preform 5 made of the core and cladding. Two movement-restraining tools 6 (movement restraining tool in the depth direction, i.e., in the Y direction) each having a width of 30 mm and a length of 500 mm and two movement-restraining tools 7 (movement restraining tool in the lateral direction, i.e., in the X direction) each having a width of 30 mm and a length of 600 mm (each being made of SUS) were attached to the upper portion of the reaction vessel 1.

$GeCl_4$ and $SiCl_4$ were supplied to the core formation burner 3 and $SiCl_4$ was supplied to the cladding formation burner 4. They were hydrolyzed to produce oxide glass particles, and pulling up was performed while the particles were adhered and deposited onto the rotating target (rod-shaped starting member 2), so that the porous glass preform with an outer diameter of 150 mm and a length of 1.5 m was obtained.

When the behavior of movement of the reaction vessel 1 at the synthesis was examined, although the upper end of the reaction vessel rose 7 mm in the reaction vessel axis direction (vertical direction), the movement was restrained in the right-and-left direction and the depth direction (X and Y directions) where the movement suppressing tools 6 and 7 were disposed. Even at the stage where synthesis of the porous glass preform by this method was continued for three months, visible cracks did not occur in the reaction vessel 1.

Comparative Example 1

The porous glass preform was manufactured by the same method as in Example 1 except that the movement restraining tools 6, 6, 7, 7 in the X and Y directions were not used. When the behavior of movement of the reaction vessel 1 at the time of the synthesis was examined, the upper end of the reaction vessel rose 6 mm in the vertical direction (the axial direction of the porous glass preform), and movement of about 4 mm occurred in the depth direction. Because of this, the fringe of the upper through hole 12 of the reaction vessel 1 was brought into contact with the support rod 8. The glass particles not adhering to the porous glass preform 5 adhered to the support rod 8. When the support rod 8 is brought into contact with the fringe of the through hole 12, the glass particles adhering to the support rod 8 is peeled off (dropped) and adheres onto the surface of the porous glass preform 5.

The above-mentioned glass particles adhering to the porous glass preform 5 may cause surface roughness of the said preform which has been consolidated or may cause a problem of breaking of the optical fiber at drawing.

Figure 2:
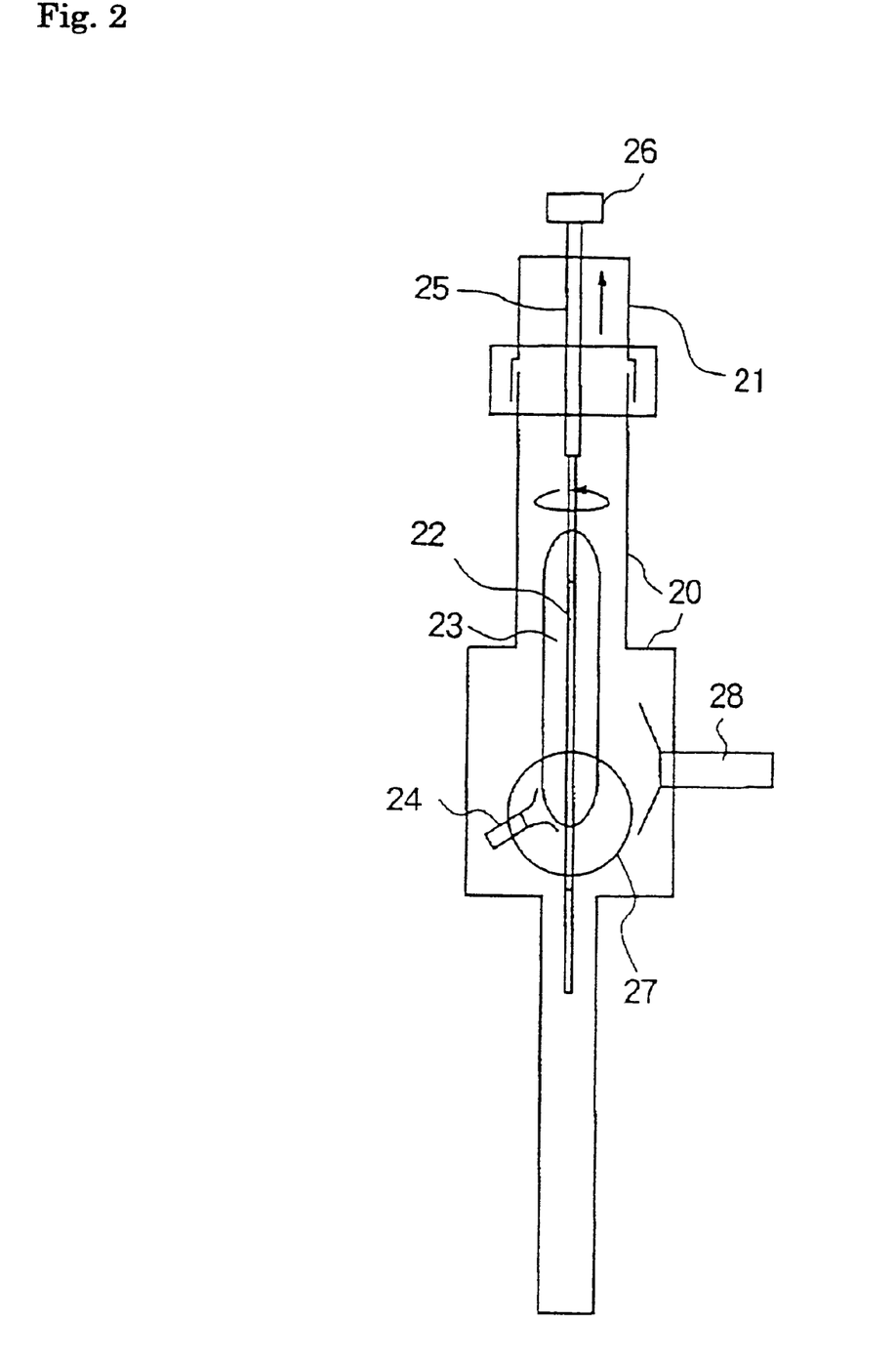
FIG. 2 is a schematic view illustrating a reaction vessel of the second embodiment of the invention.

As shown in FIG. 2, the apparatus of the third embodiment of the invention comprises the reaction vessel set in such a manner that the center axis of the porous glass preform is positioned in the vertical direction while its upper and lower portions are fixed, and as a means for relieving the effect of thermal expansion, the reaction vessel is divided into the upper and lower parts at the upper portion of the reaction vessel, and the divided portion is made into the insertion structure so that the reaction vessel can expand and contract in the vertical direction.

This apparatus is designed so that a starting rod 22 made of core only or core and cladding is pulled up while it is rotated, and glass particles containing quartz as the main ingredient are synthesized around its circumference.

The reaction vessel of this apparatus comprises a reaction vessel main body portion 20 (heated to high temperature by a flame) in which a fine glass particle synthesis burner 24 is disposed, and an upper reaction vessel 21 (relatively low temperature) for pulling up a produced porous glass preform 23. In this reaction vessel, the middle portion of the reaction vessel main body portion 20 and the upper end of the upper reaction vessel 21 are fixed to a floor, base, or the like. A through hole provided in an upper cover of the reaction vessel 21 is fixed.

For the purpose of absorbing thermal expansion of the reaction vessel main body portion 20, the reaction vessel main body portion 20 and the upper reaction vessel 21 are separated, the lower fringe of the upper reaction vessel 21 is made to overhang outward at the divided portion, and the upper fringe portion of the reaction vessel main body portion 20 is inserted into the lower fringe of the upper reaction vessel 21 in a state where there is little gap in a horizontal direction and a gap of about 10 to 20 mm in the vertical direction is provided between the upper end portion of the reaction vessel main body portion 20 and the overhanging shoulder portion of the lower fringe of the upper reaction vessel 21. As a result, when the reaction vessel main body portion 20 expands or contracts by temperature variation, its movement in a horizontal direction is restrained, while it can expand and contract in the vertical direction.

When the movement of the reaction vessel in the horizontal direction is small, the reaction vessel can be made smaller because it does not touch the porous glass preform.

The section of the reaction vessel may be polygonal such as a rectangle or may be circular.

In FIG. 2, reference numeral 25 denotes a support rod for holding the starting rod 22, 26 denotes a chuck for holding the support 25, 27 denotes a quartz window for observation, and 28 denotes an exhaust pipe.

At the divided portion of the apparatus of the fourth embodiment of the invention, a structure for making a purge with an inert gas (such as nitrogen gas), cleaning air, or the like is provided in order to prevent the air from seeping through the gap during the synthesis of a porous preform.

EXAMPLE 2

An apparatus of this example comprises the reaction vessel having the shape as shown in FIG. 2, made of Ni, and comprising the reaction vessel main portion 20 and the upper reaction vessel 21. The reaction vessel main portion 20 comprises a thick portion roughly having a width of 1 m, a depth of 0.8 m, and a height of 1 m, and a thin portion roughly having a width of 0.4 m, a depth of 0.4 m, and a height of 1.5 m. The upper reaction vessel 21 roughly has a width of 0.4 m, a depth of 0.4 m, and a height of 0.5 m. The lower fringe of the upper reaction vessel 21 overhangs outward, and the upper fringe portion of the reaction vessel main body 20 is inserted in the overhang portion with a clearance of 2 to 5 mm in a horizontal direction.

The porous glass preform made of the core and cladding manufactured in Example 1 using the above-mentioned reaction vessel was consolidated and then drawn to a rod having a suitable size (diameter of 20 to 30 mm) for the starting rod 22.

The rod was pulled up while it was rotated, and glass particles containing quartz as the main ingredient were synthesized on the circumference of the rod. $SiCl_4$ was supplied to the fine glass particle synthesis burner 24, and was hydrolyzed to produce $SiO_2$. The rotating starting rod 22 was pulled up, so that the porous glass preform 23 with an outer diameter of 220 mm and a length of 1.5 m was obtained. During the synthesis, $N_2$ gas with a flow of 50 liters/minute was made to flow in the divided portion.

When the behavior of movement of the reaction vessel main body portion 20 at the synthesis was examined, although the upper end of the reaction vessel main body portion 20 rose 9 mm in the vertical direction (the axial direction of the porous glass preform), the clearance provided in the vertical direction in the divided portion of the reaction vessel was able to absorb the expansion.

Since the lower end portion of the upper reaction vessel 21 was formed into the shape along the outer periphery of the upper end portion of the reaction vessel main body portion 20, and the latter was fit in the former, the movement in the right-and-left direction and the depth direction (X and Y directions) was restrained. Further, even at a stage where synthesis of the porous glass preform 23 by this method was continued for three months, cracks were not produced in the reaction vessel main body portion 20.

Comparative Example 2

Figure 3:
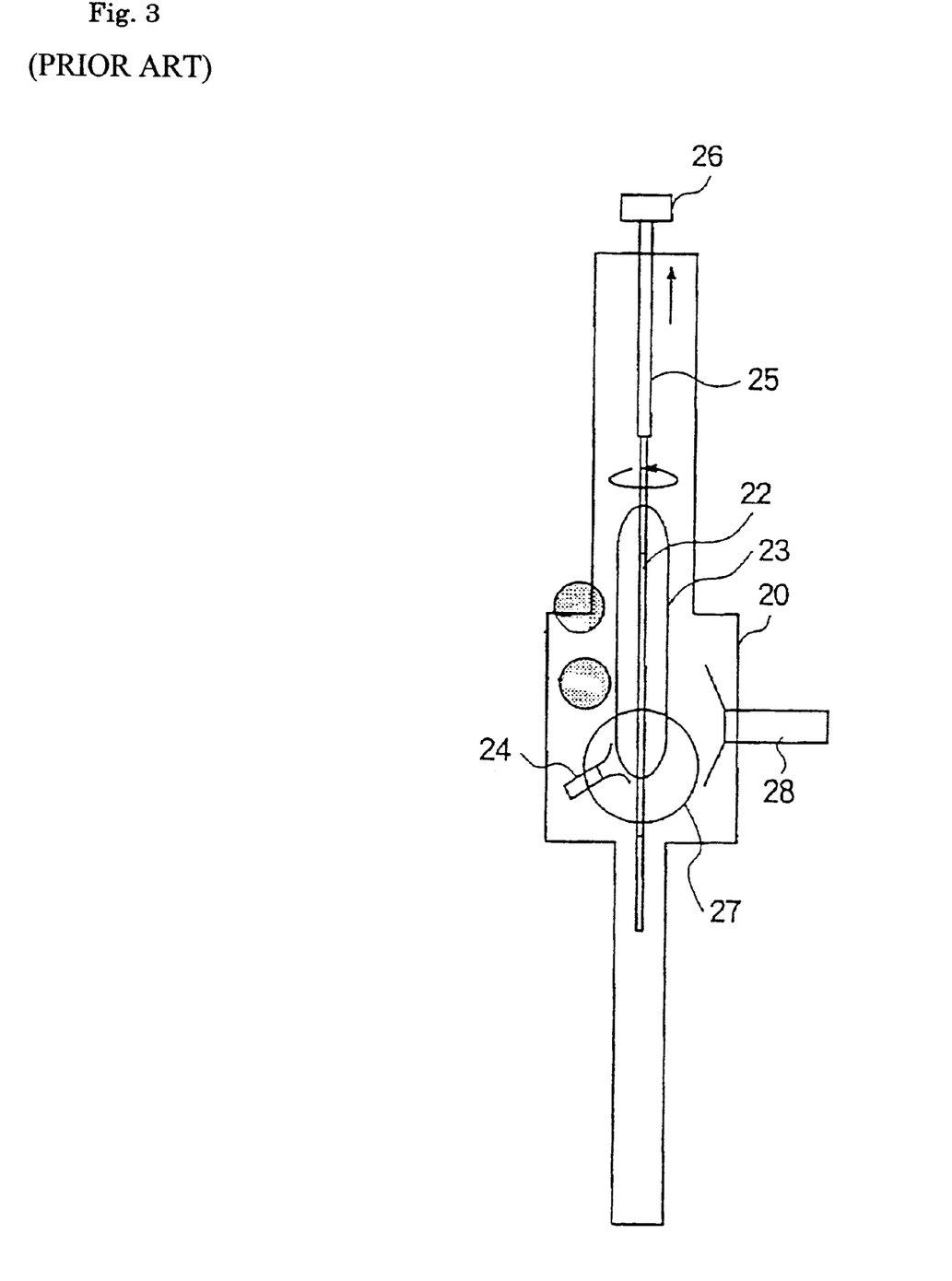
FIG. 3 is a schematic view illustrating a reaction vessel of the prior art.

FIG. 3 is a schematic view showing a prior art structure in which a divided portion is not provided at an upper portion of a reaction vessel main body portion 20, in contrast with the apparatus of FIG. 2. In FIG. 3, the same components as those of FIG. 2 are denoted by the same reference numerals. In the reaction vessel of the apparatus of FIG. 3, the main body portion and the upper portion are not separated, and the lower end portion of the reaction vessel main body portion 20 and the upper end portion of the reaction vessel are fixed to the base, floor, or the like. When the reaction vessel is used for a long period, cracks occur at a portion (for example, oblique line portions in FIG. 3) where stress due to thermal expansion is concentrated.

An apparatus shown in FIG. 3 was used and a porous glass preform was manufactured in the same manner as in Embodiment 2. The reaction vessel of this apparatus is the same as that used in Embodiment 2, except that the main portion and the upper portion are not divided. Although noticeable movement behavior was not observed during manufacture of the porous glass preform, when the use was continued for one month, cracks were produced at places shown by oblique lines in FIG. 3, leading to such circumstances as caused the manufacture to stop.

The apparatus of the fifth embodiment of the invention is characterized in that the reaction vessel which is not divided into upper and lower portions is set in such a manner that the center axis of the porous glass preform is positioned in the vertical direction, and as means for relieving the effect of thermal expansion, the upper and/or lower portion of the reaction vessel is held at the predetermined portion by the fixing members allowing the reaction vessel to expand and contract in the vertical direction.

Figure 4:
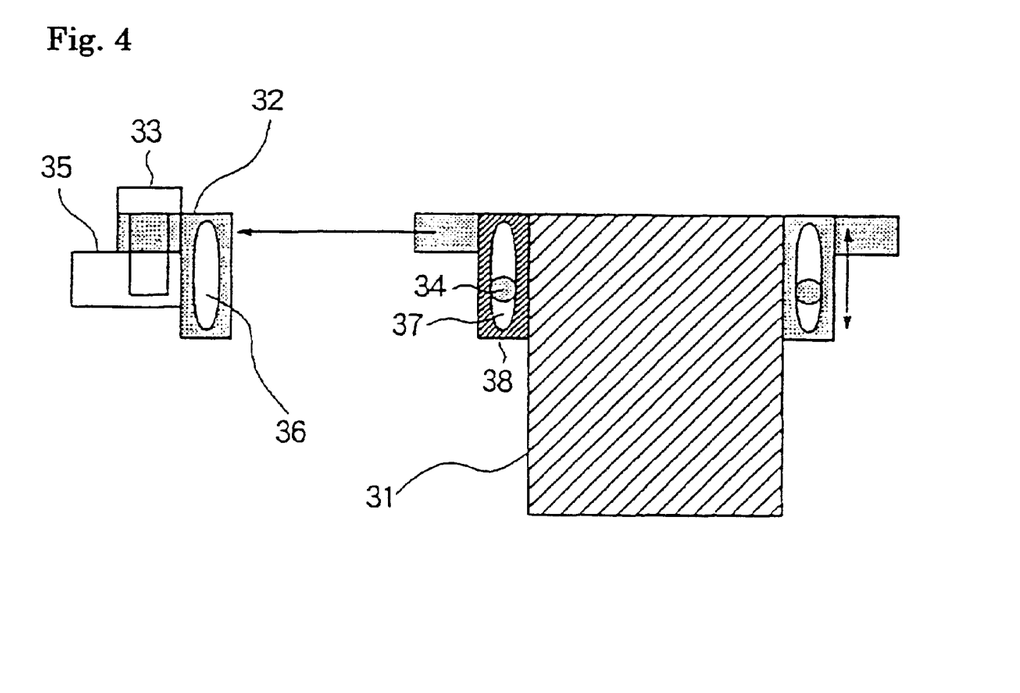
FIG. 4 is a schematic view illustrating a fixing manner of a reaction vessel of the third embodiment of the invention.

FIG. 4 shows an example of a fixing member having such a function and shows a fixing manner of an upper portion 31 of a reaction vessel main body. A main body upper portion 31 corresponds to a large diameter portion of the reaction vessel main body 20 in FIG. 3. A base side member 32 having vertically long bolt-hole 36 is fixed to a base 35 by a bolt 33. A reaction vessel side member 38 having a bolt-hole 37 corresponding to the bolt-hole 36 is attached to the side of the reaction vessel. The base side member 32 and the reaction vessel side member 38 are joined together and fastened by a bolt 34. Thus, the reaction vessel can be prevented from being subjected to the occurrence of cracks due to the concentration of stress caused by the thermal expansion.

One of the bolt holes in the base or in the side member of the reaction vessel may be an elliptic hole, and the other may be a circular hole. It is preferable that in order to prevent the reaction vessel from moving in a horizontal direction, in the case where the horizontal section of the reaction vessel is polygonal, at least one fixing member is provided at each side surface, and in the case where it is circular, the fixing members are provided at 3 to 6 places at 60° to 120° intervals so that about one fixing member is provided at every 20 to 30 cm.

EXAMPLE 3

In the use of an apparatus shown in FIG. 3, the fixing portions (four fixing portions) of the upper end of the reaction vessel main body portion 20 were made to allow the reaction vessel to expand and contract in the vertical direction by using the fixing members of the structure shown in FIG. 4. Thus, even after its manufacturing use for three months, the occurrence of cracks was prevented and the movement in the X and Y directions was restrained.

The apparatus of the sixth embodiment of the invention is equipped with the reaction vessel which is mounted on a base in the state that its movement of the vertical direction is restrained by fixing it at a plurality of places on the base in such a manner that the center axis of the porous glass preform is positioned in a horizontal direction, and as a means for relieving the effect of thermal expansion, at least a part of the fixing portions of the reaction vessel is held by the fixing members which have a structure to allow the reaction vessel to expand and contract in the axial direction of the porous glass preform.

Figure 5:
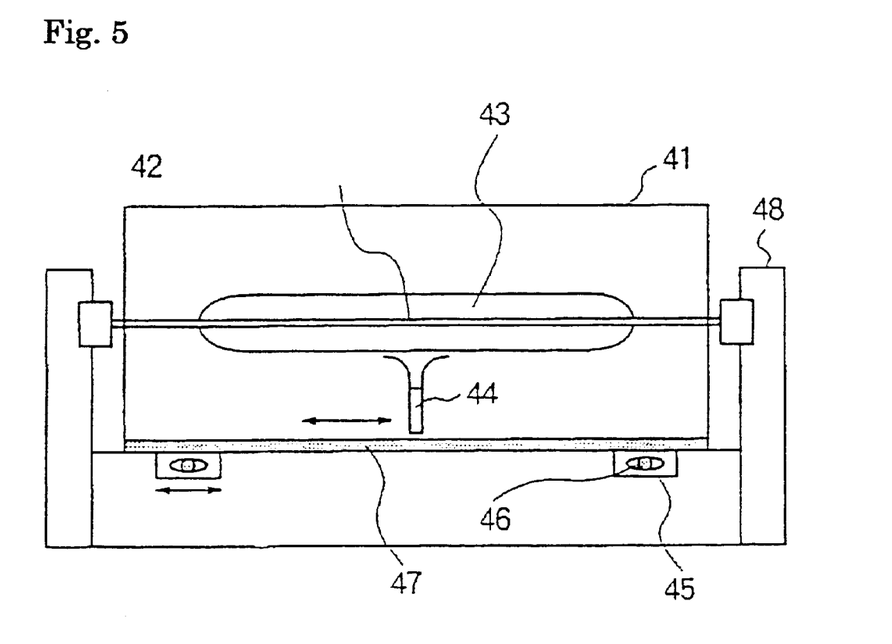
FIG. 5 is a schematic view of a reaction vessel of the fourth embodiment of the invention.

FIG. 5 shows an example of the apparatus which is provided with said fixing members and with which a porous glass preform 43 is manufactured by a method in which glass particles synthesized by a burner 44 are deposited on the circumference of an elongated glass preform (starting rod) 42 comprising a core or a core and cladding, that is, by an outside vapor-phase deposition (OVD) method.

The burner 44 is made to reciprocate in the longitudinal direction of the rotating starting rod 42 in a reaction vessel 41 which is mounted on a base 47 which is attached onto a lathe 48.

In the reaction vessel 41 in this apparatus, the whole lower surface is not fixed but is held at plurality of places with fixing members 45, which have a similar function as the fixing member shown in FIG. 4, so that a part of the fixing places is in a state that can, by means of bolts 46, move several mm to several cm in the axial direction of the porous glass preform. Thus, the occurrence of cracks due to the concentration of stress caused by thermal expansion can be prevented.

Incidentally, it is more effective to provide, according to necessity, around the reaction vessel as in the apparatus of the second embodiment of the invention, the fixing members which prevent the reaction vessel from moving in the vertical direction of the axis of the porous glass preform.

EXAMPLE 4

Using an apparatus made of Ni, having the shape as shown in FIG. 5, with, approximately, a length of 2 m, a depth of 0.8 m, and a height of 0.8 m, a porous glass preform 43 was manufactured by the OVD method.

Fixing of the lower surface was made in such a manner that the lower surface of the reaction vessel was set on a frame in a state where the whole surface was not fixed but the fixing member 45 with a structure similar to that shown in FIG. 4 was used at each of four portions (only two portions are shown in the drawing) shown in FIG. 5, so that the lower surface was able to expand and contract in the right-and-left direction.

In this apparatus, $SiO_2$ fine particles which were synthesized by hydrolyzing $SiCl_4$ supplied to the burner 44 were deposited, by reciprocating the burner 44 and rotating the starting rod 42, on the circumference of the starting rod 42 having a suitable size (diameter of 20 to 30 mm) made by elongating the porous glass preform made of the core and cladding manufactured in Example 1 which was consolidated. Thus, the porous glass preform 43 with an outer diameter of about 200 mm and a length of 1.2 m was obtained.

Although this manufacture was continued for a considerable period, nothing unusual was observed on the porous glass preform under production, and the reaction vessel did not suffer such problem as occurrence of cracks even after three month use.

Figure 6:
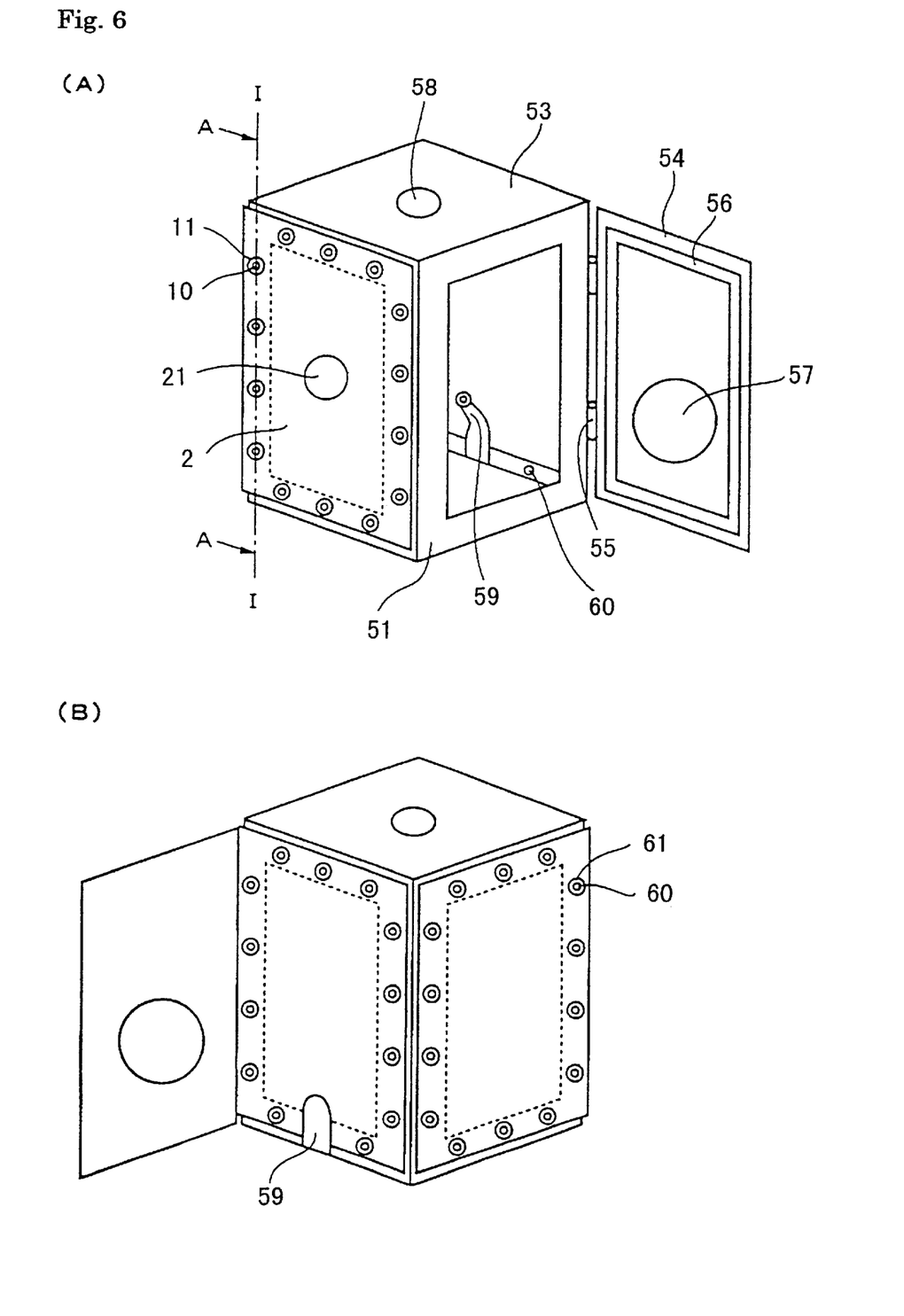
FIGS. 6A and 6B are views illustrating a reaction vessel of the fifth embodiment of the invention.

The reaction vessel of the seventh embodiment of the invention is described with reference to FIGS. 6A and 6B. FIG. 6B is a view showing the reaction vessel of FIG. 6A seen from the opposite side. One of the sides is of a door structure, which will be referred to as a door member 54. The door member 54 is connected to a frame 51 through a hinge 55. The door member 54 is provided with a window 57 sealed hermetically with heat-resistant glass or the like so that the inside of the reaction vessel can be observed while the door member 54 is closed. For the purpose of increasing the sealing properties when the door member 54 is closed, it is preferable that a sealing member 56 is provided so as to be in contact with the door member 54 or the frame 51.

A burner 59 for blowing an oxyhydrogen flame and glass particles is disposed so as not to be opposite the door member 54.

A member forming a side which does not have the door structure will be referred to as a side member 52. Since the side member opposite to the burner 59 is subject to the highest temperature among the side members, it is preferable that at least this side member is connected to the frame in such a manner that it can slide in accordance with thermal expansion or thermal contraction. It is more preferable that side members not opposite to burner 59 are also connected to the frame in the same manner.

Figure 8:
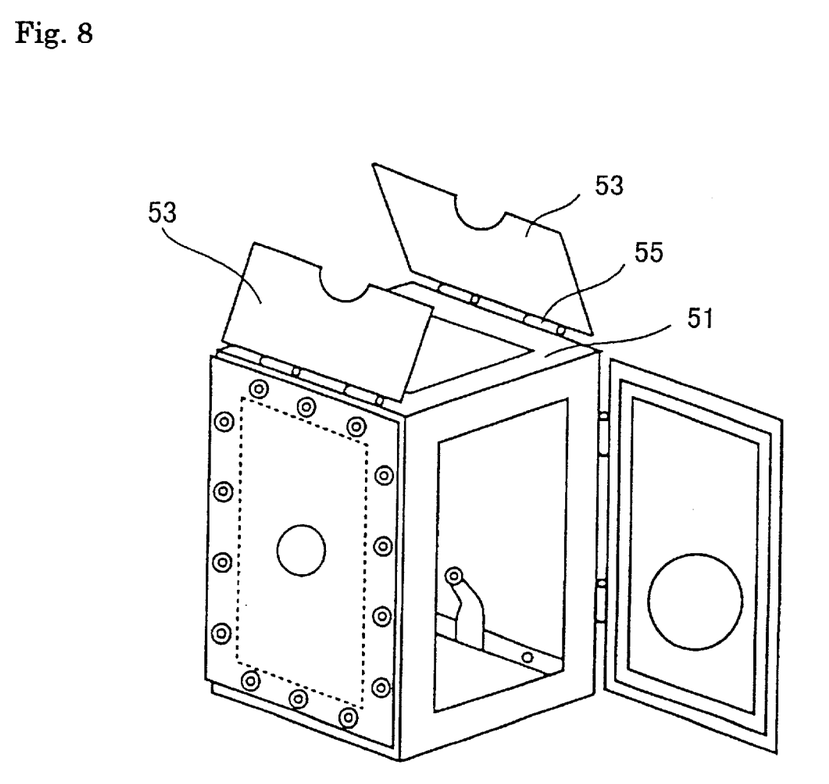
FIG. 8 is a view illustrating a reaction vessel in which a bottom member includes a door structure.

The upper surface member 53 is provided with a hole 58 for allowing a rod-shaped starting member and a porous glass preform to pass through. During the manufacture of the porous optical fiber preform, one end of the support rod which is connected with the rod-shaped starting member protrudes from the hole 58 to the outside of the reaction vessel, and is fixed at the outside of the reaction vessel. For the purpose of facilitating the operation to lastly pull out the porous glass preform from the reaction vessel, it is preferable that the upper surface member 53 is divided into two portions as shown in FIG. 8, and each portion of the upper surface member 53 is fixed to the frame 51 through a hinge 55, to make a door structure. The means for fixing the upper surface member 53 to the frame 51 is not particularly limited.

The side member opposite to burner 59 is provided with a hole 21 through which an exhaust hood (not shown in the drawing) is attached.

In FIGS. 6A, 6B and 8, although the rectangular parallelepiped reaction vessel is illustrated, other shapes, for example, a cylindrical reaction vessel may be used. In the case where the reaction vessel is cylindrical, it is satisfactory if the side is divided into some side members along the circumference, and at least one of them is connected to frame 51 to allow it to move in accordance with expansion or contraction.

Figure 7:
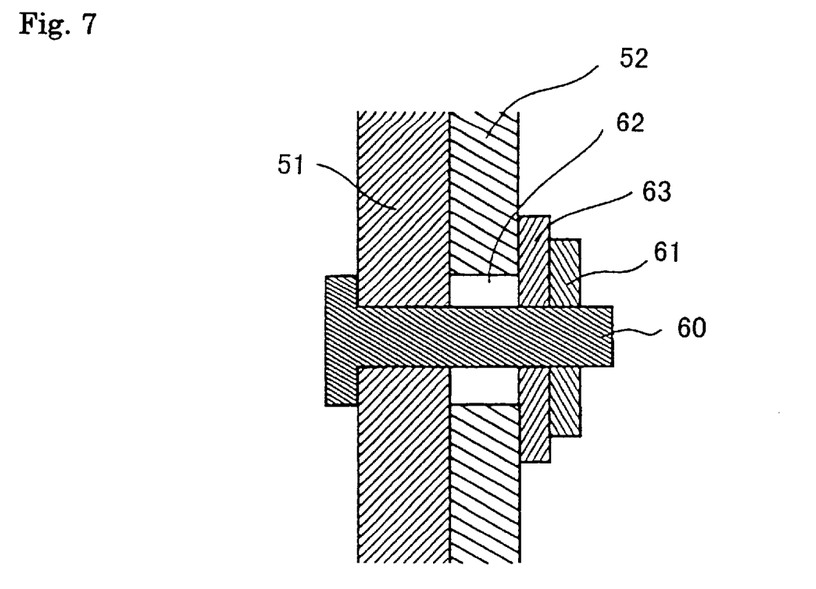
FIG. 7 is a sectional view of a portion I—I shown in FIG. 6A and seen from the direction of an arrow A.

As shown in FIG. 7, the apparatus of the eighth embodiment of the invention is characterized in the structure where the frame 51 and the side member 52 are connected in a movable manner through a bolt and a nut, which combine the frame and the side member by fastening the nut, while a hole which has a diameter larger than that of the bolt is provided in the frame or in the side member.

FIG. 7 is a view showing one bolt at a place I—I shown in FIG. 6A and seen from the direction of arrow A.

The bolt passes through respective holes of the frame 51 and the side member 52. Further, the bolt passes through a washer 63 with an outer diameter larger than the diameter of the hole 62 of the side member 52, and the frame 51 and side member are fastened and fixed by a nut 61. In the case where the outer diameter of the nut is made larger than the hole 62, the washer may be omitted. It is preferable that the diameter of the hole 62 of the side member 52 is 2.0 to 2.5 times as large as the diameter of the bolt 10. The major axis of an elliptic hole may be applied to this diameter. In this case, it is preferable that the diameter of the hole of the frame is the minimum diameter that allows the bolt to pass through the hole.

As described above, in the reaction vessel explained with reference to FIGS. 6A and 6B, the diameter of the hole in the frame or the side member is larger than the diameter of the bolt, even in the case where the side member is expanded by heat, each hole portion slides and shifts relatively to the bolt, so that the stress due to heat expansion can be absorbed and relieved. Thus, the occurrence of cracks or distortion of the reaction vessel can be prevented, and the apparatus is not damaged.

Figure 9:
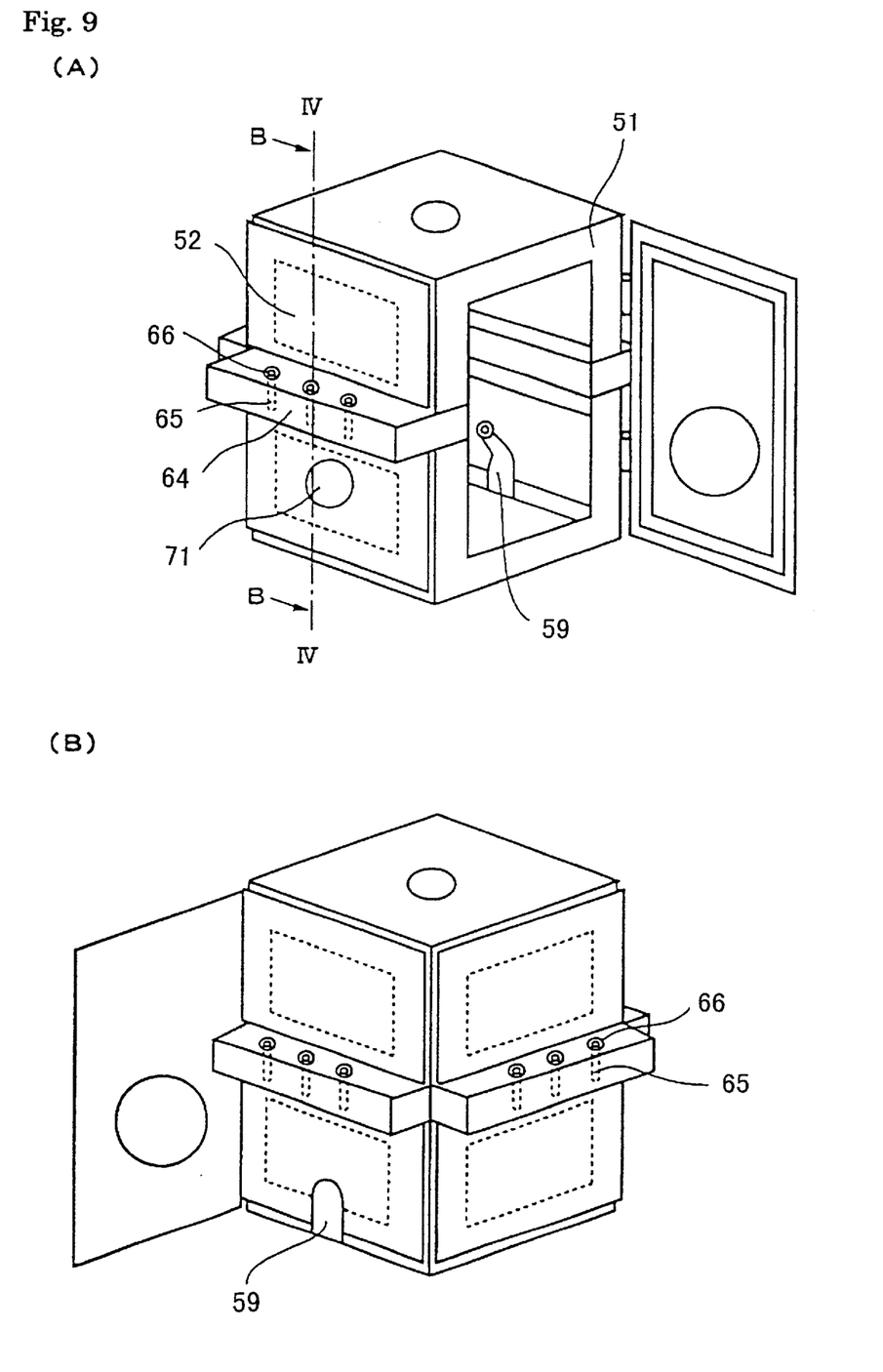
FIGS. 9A and 9B are views illustrating a reaction vessel of the sixth embodiment of the invention.

The apparatus of the ninth embodiment of the invention is described with reference to FIGS. 9 and 10.

As a means for absorbing and relieving the stress, even in the case where the side member is expanded by heat, at least a side not forming a door structure is divided so that two or more side members 52 are arranged side by side in the longitudinal direction, and at the divided portions the frame is joined together through a buffer member 64.

FIG. 9B is a view showing the reaction vessel of FIG. 9A seen from the opposite side. FIG. 10 is a sectional view showing a divided portion taken along line IV—IV shown in FIG. 9A and seen from the direction of an arrow B.

Figure 10:
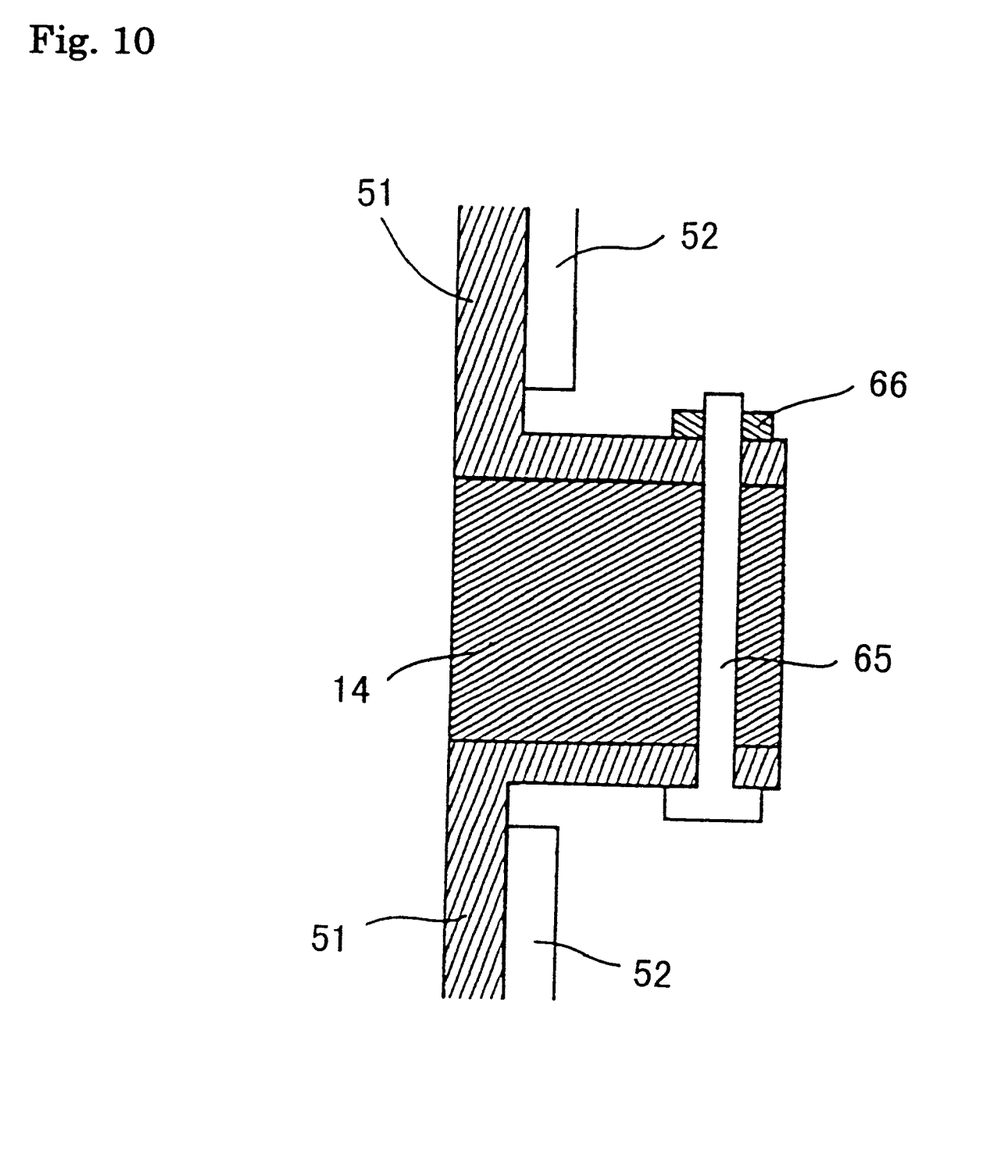
FIG. 10 is a sectional view of a divided portion of FIG. 9A taken along IV—IV and seen from the direction of an arrow B.

FIGS. 9A, 9B and 10 show an example in which a frame 51 is divided into two portions in the longitudinal direction, and the divided portions are joined together by a bolt 65 and a nut 66 through a buffer member 64 for absorbing expansion.

In this case, no limitation is imposed as to the diameter of holes provided in the frame 51 and the buffer member 64 to allow the bolt 65 to pass through for connection of the divided portions.

A material which absorbs heat and expansion, having a heat resistance against temperatures of 400° C. or higher, is used for the buffer member 64. Specifically, ceramic fibers such as graphite carbon, asbestos, and glass wool can be cited.

Instead of the buffer member, the divided portion may be made to have a bellows structure.

Since the side opposite to a burner 59 is subject to the highest temperature among the sides, it is preferable that at least this side is divided into two or more side members which are arranged side by side in the longitudinal direction of the porous glass preform. It is more preferable that the sides not opposite to the burner 59 are also divided in the same manner.

The means for joining the side members 52 to the frame 51 is not particularly limited. Although FIGS. 9A and 9B illustrate a case in which the joining is made by welding, the frame 51 and the side members 52 may be joined each other in a slidable manner as in the apparatus of the seventh embodiment of the invention.

The shapes of a door member, a bottom member, and the reaction vessel are the same as those explained in the apparatus of the seventh embodiment of the invention.

Figure 11:
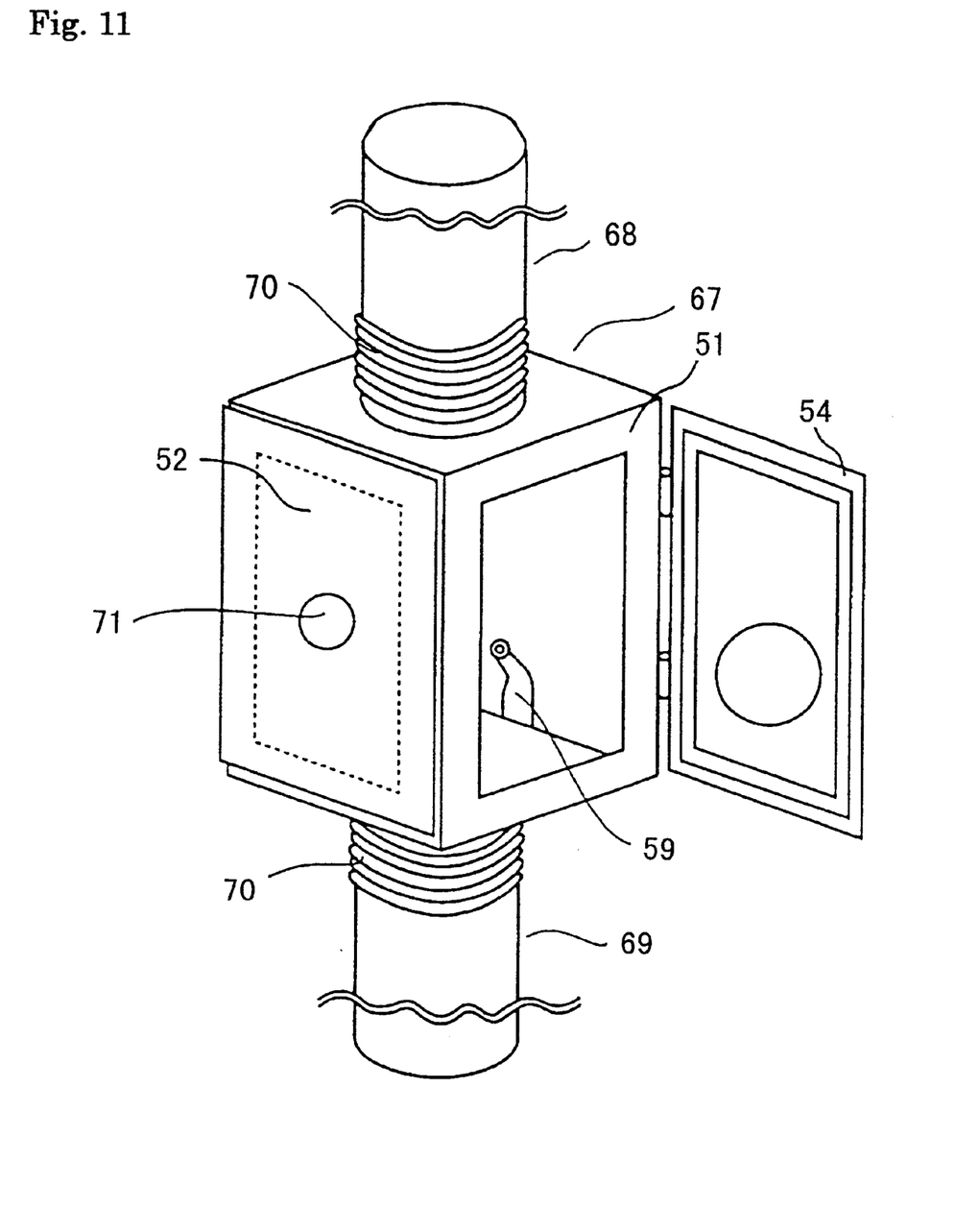
FIG. 11 is a view illustrating a reaction vessel of the seventh embodiment of the invention.

The apparatus of the tenth and the eleventh embodiments of the invention are described with reference to FIG. 11. As the means for absorbing and relieving the stress due to thermal expansion, the reaction vessel is divided into plural reaction vessels (for example, main reaction vessel 67 and upper reaction vessel 68; or main reaction vessel 67, upper reaction vessel 68 and lower reaction vessel 69), and the joint portions of said plural reaction vessels are joined together through a buffer member 70.

The main reaction vessel 67 contains a burner 59. Cracks or distortion are often produced by stress due to thermal expansion at a joint portion between the main reaction vessel 67 and the upper reaction vessel 68 or between the main reaction vessel 67 and the lower reaction vessel 69. Thus, this portion is divided and joined together through a buffer member 70. FIG. 11 shows an example in which such divided portions are joined together through a bellows 70. The joining between the bellows 70 and the main reaction vessel 67, the upper reaction vessel 68, or lower reaction vessel 69 can be done by welding or using a flange or the like. It is preferable that the material of bellows 70 is the same as that of the reaction vessel. The buffer member as explained in the apparatus of the ninth embodiment of the invention may be used. The upper reaction vessel becomes an inlet portion and an outlet portion for a porous preform of an optical fiber.

Since the porous glass preform is not positioned below the burner 59 in a reaction vessel for manufacturing a porous glass preform by the VAD method, the lower reaction vessel 69 shown in FIG. 11 can be omitted.

In the case where the porous optical fiber preform is manufactured by the OVD method, since there are cases where the porous glass preform is positioned below the burner 59, the lower reaction vessel 69 is used.

The means for joining the side members 52 to the frame 51 is not particularly limited. Although FIG. 11 illustrates a case where the joining is made by welding, the frame 51 and the side members 52 are joined together in a slidable manner as in the apparatus of the seventh embodiment of the invention.

The shape of the door member 54, the hole 71, and the reaction vessel may be the same as that explained in the apparatus of the seventh embodiment of the invention. For example, although FIG. 11 illustrates that the upper reaction vessel 68 and the lower reaction vessel 69 are cylindrical, respectively, other shapes, for example, a rectangular parallelepiped shape may be used.

During the manufacture of a porous glass preform, the inside of the reaction vessel contains a hydrochloric acid atmosphere, and there are cases where the inner surface of the reaction vessel may rust. In such case where rust is produced, the rust often becomes fine powders that seep into the porous glass preform. If such powders exist in the optical fiber, the performance of the optical fiber is damaged and its quality lowered. Thus, if, by any chance the powders seep into the porous glass preform, they must be removed. Since nickel is metal which can be removed relatively easily from the porous glass preform, nickel is preferable as a material of the reaction vessel.

What is claimed is:

1. An apparatus for manufacturing a porous glass preform by depositing glass particles blown from a burner on a seed rod rotating around its axis, wherein a reaction vessel is provided with means for relieving the stress caused in the axial direction of the porous glass preform due to the thermal expansion of said reaction vessel; wherein said reaction vessel is set such that the center axis of the porous glass preform is positioned in the vertical direction, the upper portion of said reaction vessel being divided into upper and lower parts having an insertion structure which allows said reaction vessel to expand and contract in the vertical direction; and wherein said insertion structure is provided with a means for allowing a purge gas to flow.

2. An apparatus for manufacturing a porous glass preform by depositing glass particles blown from a burner on a seed rod rotating around its axis, wherein a reaction vessel is provided with means for relieving the stress caused in the axial direction of the porous glass preform due to the thermal expansion of said reaction vessel, and wherein said reaction vessel comprises a frame and side members without a door structure, at least one of said side members being joined to said frame in such a manner that it can move relative to said frame according to its expansion or contraction.

3. An apparatus for manufacturing a porous glass preform according to claim 2, wherein one of said side members is joined to said frame with a bolt and a nut, a hole with a diameter that is 2.0 to 2.5 times as large as the diameter of said bolt being provided in at least one of said frame or said side members for allowing said bolt to pass through.

4. An apparatus for manufacturing a porous glass preform by depositing glass particles blown from a burner on a seed rod rotating around its axis, wherein a reaction vessel is provided with means for relieving the stress caused in the axial direction of the porous glass preform due to the thermal expansion of said reaction vessel, and wherein said reaction vessel comprises a frame and side members forming a side without a door structure, the side being divided such that two or more side members are arranged side by side in the axial direction of the porous glass preform, said frame being joined together at the divided portion through a buffer member which absorbs the thermal expansion.

5. An apparatus for manufacturing a porous glass preform by depositing glass particles blown from a burner on a seed rod rotating around its axis, wherein a reaction vessel is provided with means for relieving the stress caused in the axial direction of the porous glass preform due to the thermal expansion of said reaction vessel, and wherein said reaction vessel comprises an upper reaction vessel and a main reaction vessel containing said burner, the bottom of said upper reaction vessel being in the upper portion of said main reaction vessel, the joint portions of said main reaction vessel and said upper reaction vessel being joined together through a buffer member.

6. An apparatus for manufacturing a porous glass preform by depositing glass particles blown from a burner on a seed rod rotating around its axis, wherein a reaction vessel is provided with means for relieving the stress caused in the axial direction of the porous glass preform due to the thermal expansion of said reaction vessel, and wherein said reaction vessel comprises a lower reaction vessel and a main reaction vessel containing said burner, the upper portion of said lower reaction vessel being in the bottom of said main reaction vessel; the joint portions of said main reaction vessel and said lower reaction vessel being joined together through a buffer member.

7. An apparatus for manufacturing a porous glass preform according to claim 4, wherein said buffer member is a bellows.

8. An apparatus for manufacturing a porous glass preform according to claim 5, wherein said buffer member is a bellows.

9. An apparatus for manufacturing a porous glass preform according to claim 6, wherein said buffer member is a bellows.

* * * * *